US009131623B2

(12) United States Patent
Buuck

(10) Patent No.: US 9,131,623 B2
(45) Date of Patent: Sep. 8, 2015

(54) LOW-PROFILE CIRCUIT BOARD ASSEMBLY

(71) Applicant: Amazon Technologies, Inc., Reno, NV (US)

(72) Inventor: David C. Buuck, Prunedale, CA (US)

(73) Assignee: Amazon Technologies, Inc., Reno, NV (US)

(*) Notice: Subject to any disclaimer, the term of this patent is extended or adjusted under 35 U.S.C. 154(b) by 0 days.

(21) Appl. No.: 14/459,655

(22) Filed: Aug. 14, 2014

(65) Prior Publication Data

US 2014/0355234 A1 Dec. 4, 2014

Related U.S. Application Data

(63) Continuation of application No. 12/607,769, filed on Oct. 28, 2009, now Pat. No. 8,837,159.

(51) Int. Cl.
*H05K 1/18* (2006.01)
*H05K 1/02* (2006.01)
(Continued)

(52) U.S. Cl.
CPC .............. *H05K 1/181* (2013.01); *H05K 1/111* (2013.01); *H05K 1/141* (2013.01); *H05K 1/184* (2013.01); *H05K 3/30* (2013.01); *H05K 1/142* (2013.01); *H05K 1/182* (2013.01); *H05K 2201/1003* (2013.01); *H05K 2201/10015* (2013.01); *H05K 2201/10022* (2013.01); *H05K 2201/10121* (2013.01); *H05K 2201/10159* (2013.01); *H05K 2201/10166* (2013.01);
(Continued)

(58) Field of Classification Search
CPC ....... H05K 1/182; H05K 1/183; H05K 1/184; H05K 1/0272

USPC ................... 361/774, 760, 761, 768
See application file for complete search history.

(56) References Cited

U.S. PATENT DOCUMENTS 4,413,308 A 11/1983 Brown
4,758,927 A 7/1988 Berg
(Continued)

FOREIGN PATENT DOCUMENTS

JP 11297876 A 10/1999
WO WO2007003414 1/2007
WO WO 2014187926 A1 * 11/2014

OTHER PUBLICATIONS

Final Office Action for U.S. Appl. No. 12/607,769, mailed on Jan. 16, 2014, David C. Buuck, "Low-profile Circuit Board Assembly", 14 pages.
(Continued)

*Primary Examiner* — Jeremy C Norris
*Assistant Examiner* — Nathan Milakovich
(74) *Attorney, Agent, or Firm* — Lee & Hayes, PLLC

(57) ABSTRACT

Devices and methods for constructing low-profile, minimal-thickness electronic devices using existing production techniques are disclosed in this application. An electronic component and interposer form a sub-assembly. The sub-assembly is placed in an aperture in a circuit board with the interposer providing interconnections between the electronic component and the circuit board. The circuit board is coupled to the electronic component at least by one or more fluidic channels included in the interposer. The sub-assembly placed in the aperture in the circuit board as described herein conceals the thickness of the integrated circuit within the thickness of the circuit board, reducing overall thickness.

20 Claims, 8 Drawing Sheets

(51) Int. Cl.
  *H05K 1/11* (2006.01)
  *H05K 3/30* (2006.01)
  *H05K 1/14* (2006.01)
(52) U.S. Cl.
  CPC .............. *H05K 2201/10174* (2013.01); *H05K 2201/10378* (2013.01); *Y10T 29/4913* (2015.01)

(56) References Cited

U.S. PATENT DOCUMENTS

| | | | |
|---|---|---|---|
| 4,843,188 A | 6/1989 | Patterson et al. | |
| 4,979,076 A | 12/1990 | DiBugnara | |
| 5,016,138 A * | 5/1991 | Woodman | 361/688 |
| 5,598,032 A | 1/1997 | Fidalgo | |
| 5,768,109 A | 6/1998 | Gulick et al. | |
| 5,926,376 A | 7/1999 | Cho | |
| 6,028,774 A | 2/2000 | Shin et al. | |
| 6,078,506 A | 6/2000 | Sugahara | |
| 6,137,693 A | 10/2000 | Schwiebert et al. | |
| 6,140,144 A * | 10/2000 | Najafi et al. | 438/53 |
| 6,292,368 B1 | 9/2001 | Pradel | |
| 6,303,992 B1 * | 10/2001 | Van Pham et al. | 257/734 |
| 6,331,737 B1 | 12/2001 | Lim et al. | |
| 6,443,179 B1 * | 9/2002 | Benavides et al. | 137/454.2 |
| 6,467,692 B1 | 10/2002 | Tarantino et al. | |
| 6,490,161 B1 | 12/2002 | Johnson | |
| 6,771,859 B2 * | 8/2004 | Carpenter | 385/52 |
| 6,813,154 B2 | 11/2004 | Diaz et al. | |
| 6,937,824 B2 * | 8/2005 | Watanabe | 398/135 |
| 7,032,392 B2 * | 4/2006 | Koeneman et al. | 62/77 |
| 7,045,901 B2 | 5/2006 | Lin et al. | |
| 7,053,314 B1 | 5/2006 | Camerlo | |
| 7,061,104 B2 * | 6/2006 | Kenny, Jr. et al. | 257/714 |
| 7,141,884 B2 * | 11/2006 | Kojima et al. | 257/778 |
| 7,154,172 B2 | 12/2006 | Silverbrook | |
| 7,215,547 B2 * | 5/2007 | Chang et al. | 361/701 |
| 7,245,500 B2 | 7/2007 | Khan et al. | |
| 7,361,844 B2 | 4/2008 | Vinciarelli et al. | |
| 7,394,665 B2 | 7/2008 | Hamasaki et al. | |
| 7,434,308 B2 * | 10/2008 | Lu et al. | 29/830 |
| 7,515,415 B2 * | 4/2009 | Monfarad et al. | 361/699 |
| 7,723,144 B2 * | 5/2010 | Chen | 438/50 |
| 7,763,489 B2 * | 7/2010 | Chen et al. | 438/51 |
| 8,011,589 B2 | 9/2011 | Kato et al. | |
| 8,730,673 B2 * | 5/2014 | Vos | 361/699 |
| 8,824,146 B2 * | 9/2014 | Brok et al. | 361/701 |
| 2001/0020535 A1 | 9/2001 | Takahashi et al. | |
| 2003/0096081 A1 * | 5/2003 | Lavallee et al. | 428/138 |
| 2004/0090755 A1 | 5/2004 | Yatsu | |
| 2004/0150962 A1 | 8/2004 | Heinemann et al. | |
| 2005/0121224 A1 | 6/2005 | Lien | |
| 2005/0189640 A1 | 9/2005 | Grundy et al. | |
| 2005/0282002 A1 | 12/2005 | Husemann et al. | |
| 2006/0050493 A1 | 3/2006 | Hamasaki et al. | |
| 2006/0055010 A1 | 3/2006 | Kheng | |
| 2006/0097370 A1 | 5/2006 | Bartley et al. | |
| 2008/0036556 A1 | 2/2008 | Harrington | |
| 2008/0070000 A1 | 3/2008 | Suzuki | |
| 2008/0123309 A1 | 5/2008 | Kang et al. | |
| 2008/0192433 A1 | 8/2008 | Furuyama et al. | |
| 2009/0040739 A1 | 2/2009 | Hamasaki et al. | |
| 2009/0041994 A1 | 2/2009 | Ockenfuss et al. | |
| 2009/0091903 A1 | 4/2009 | Hsu et al. | |
| 2009/0151150 A1 | 6/2009 | Ayala et al. | |
| 2010/0171213 A1 * | 7/2010 | Hisano et al. | 257/714 |
| 2011/0228489 A1 * | 9/2011 | Emery et al. | 361/748 |
| 2011/0254897 A1 * | 10/2011 | Nystrom et al. | 347/47 |
| 2012/0009973 A1 | 1/2012 | Demuynck et al. | |
| 2012/0039055 A1 * | 2/2012 | Yamamoto et al. | 361/760 |
| 2012/0052560 A1 * | 3/2012 | Knight et al. | 435/286.1 |
| 2013/0068509 A1 | 3/2013 | Pyeon | |
| 2013/0223010 A1 * | 8/2013 | Shioga et al. | 361/700 |
| 2014/0016270 A1 * | 1/2014 | Bonkohara | 361/699 |
| 2014/0045191 A1 * | 2/2014 | DeJohn et al. | 435/6.12 |
| 2014/0061049 A1 * | 3/2014 | Lo et al. | 204/547 |
| 2014/0083858 A1 * | 3/2014 | Teh et al. | 204/601 |

OTHER PUBLICATIONS

Final Office Action for U.S. Appl. No. 12/607,769, mailed on Jan. 14, 2013, David C. Buuck, "Low-profile Circuit Board Assembly", 13 pages.
Non-Final Office Action for U.S. Appl. No. 12/607,769, mailed on Jun. 15, 2012, David C. Buuck, "Low-profile Circuit Board Assembly", 9 pages.
Office action for U.S. Appl. No. 12/607,769, mailed on Jul. 10, 2013, Buuck, "Low-profile Circuit Board Assembly", 12 pages.

* cited by examiner

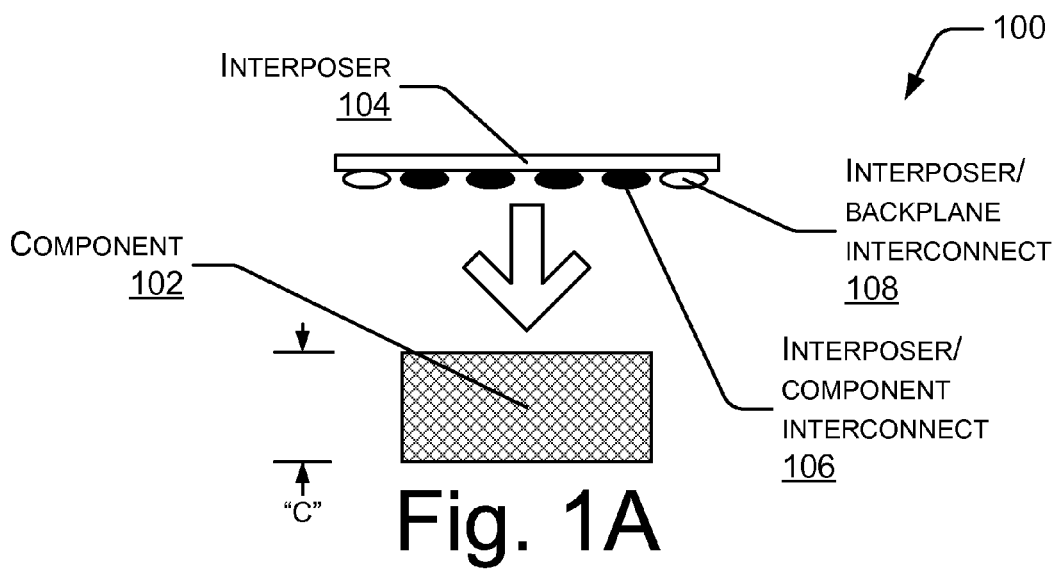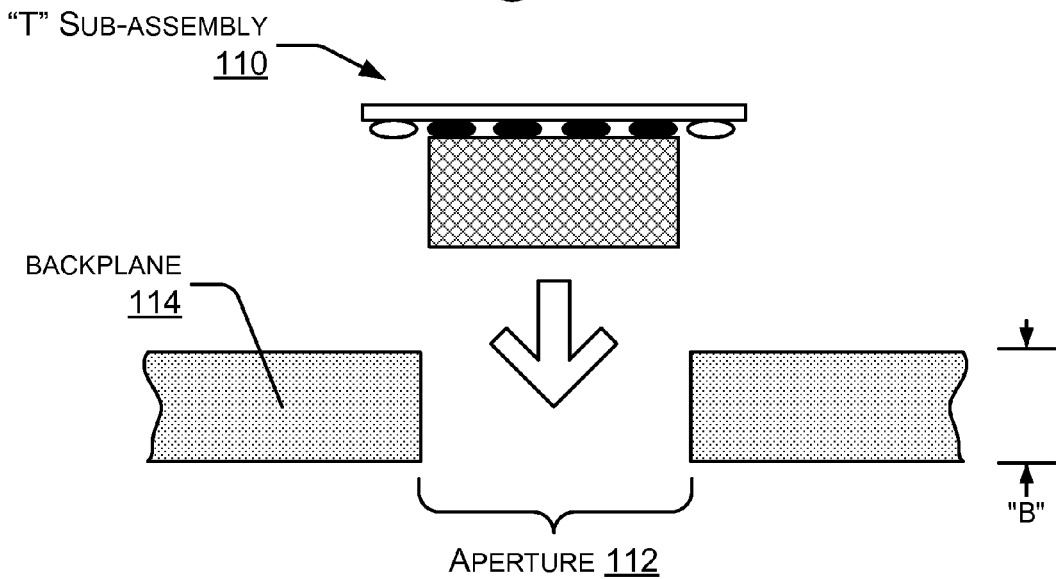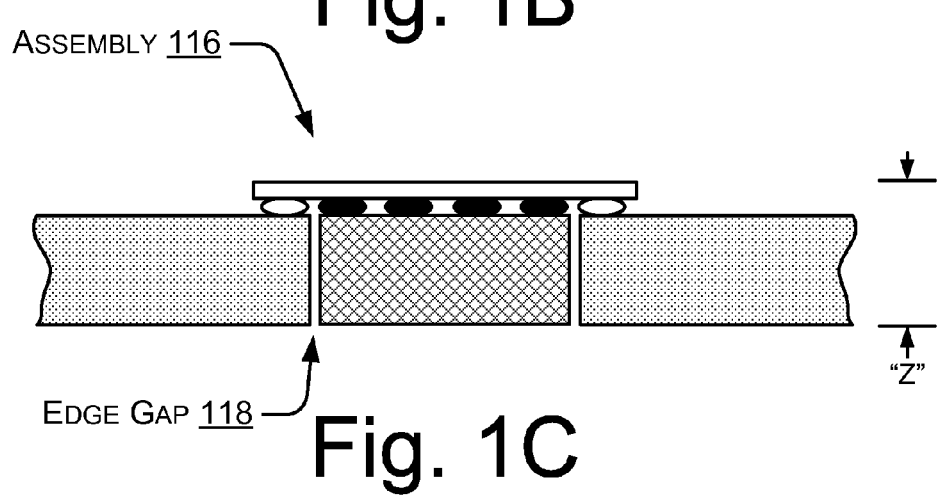

LOW-PROFILE CIRCUIT BOARD ASSEMBLY

RELATED APPLICATIONS

This application claims priority to and is a continuation of U.S. patent application Ser. No. 12/607,769, filed on Oct. 28, 2009, the entire contents of which are incorporated herein by reference.

BACKGROUND

Mobile users increasingly demand devices having smaller and smaller form factors (that is, an overall size of the device). The advent of surface mount technology ("SMT") has resulted in thinner devices, such as cellular phones, portable media players, table computers, netbooks, laptops, electronic book readers, and so forth. SMT places surface mount devices ("SMDs") on the surface of a circuit board. These surface mount devices may include integrated circuits, discrete components, and so forth. However, traditional SMT results in a device which is at least as thick as the height of the circuit board plus the height of the SMD.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

FIGS. 1A-1C depict cross-sectional views of joining a component, such as an integrated circuit ("IC"), and an interposer to form a "T" sub-assembly which is then placed in an aperture in a backplane and joined to the component, resulting in a low-profile assembly.

DETAILED DESCRIPTION

Figure 2:
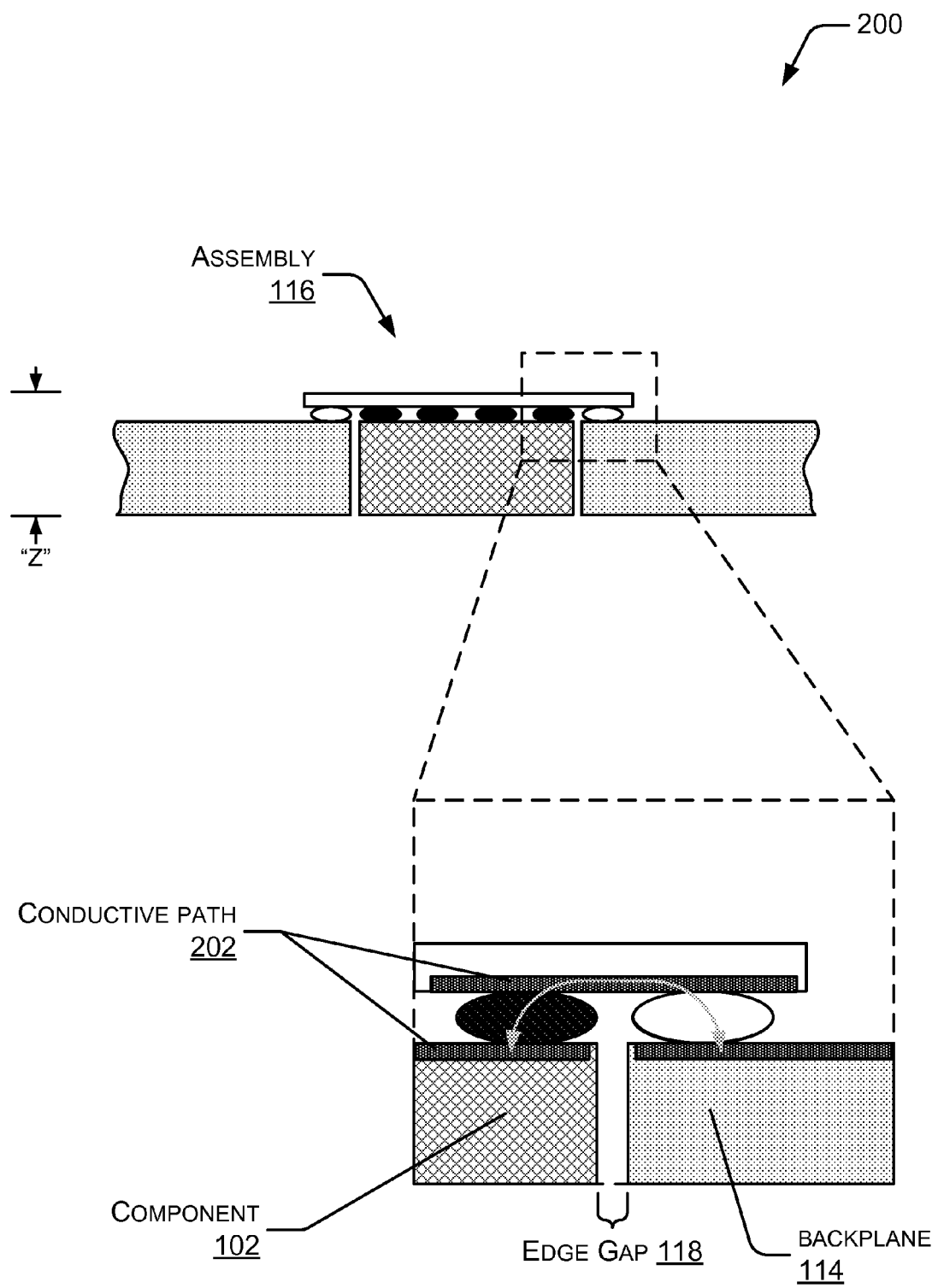
FIG. 2 depicts a cross-sectional view and an enlargement of a pathway between the component and the backplane provided by the interposer.

This disclosure is directed, in part, to low-profile assemblies comprising a backplane and a component, as well as a method for constructing such low-profile assemblies. These low-profile assemblies may be used in electronic devices, such as laptops, electronic book readers, portable media players, smartphones, and so forth. By using low-profile assemblies, thinner devices may be made. This application uses the term "electronic" for convenience, and not by way of limitation. For example, the devices and methods used here may apply to devices which are electronic, optical, optoelectronic, spintronic, and so forth. Also the term "low-profile" as used in this application indicates an assembly which has an overall thickness "Z" less than a sum of a thickness of the circuit board "B" plus a thickness of a component "C." Stated another way, $Z<(C+B)$.

Furthermore, the devices and methods discussed herein are compatible with existing component packaging and assembly techniques. Thus, existing packaging technologies such as land grid array ("LGA") and ball grid array ("BGA") as well as assembly techniques such as automated pick-and-place may be used with some implementations described herein.

The discussion begins with a section entitled "Illustrative Arrangements," which describes several non-limiting examples of the claimed devices. Among these examples are a "T" sub-assembly, a recessed "T" sub-assembly, a "H" sub-assembly, a "C" sub-assembly, and a "T" package. A section entitled "Illustrative Processes" follows, and describes example flow diagrams of one implementation of the process for assembling the devices. Finally, a brief conclusion ends the discussion.

This brief introduction, including section titles and corresponding summaries, is provided for the reader's convenience and is not intended to limit the scope of the claims, nor the proceeding sections. Furthermore, the techniques described in detail below may be implemented in a number of ways and in a number of contexts. Example implementations and context are provided and described below in more detail. However, it is to be appreciated that the following implementations and context are but some of many.

Illustrative Arrangements

"T" Sub-Assembly

FIG. 1A depicts a component 102 having a height "C." Components include capacitors, resistors, inductors, diodes, memristors, transistors, semiconductor devices, integrated circuits ("ICs") optical devices, power converters, optoelectronic devices, and so forth. These components may be analog, digital, or combination devices.

The component 102 may be joined with an interposer 104, along a direction indicated by an arrow. An interposer 104 comprises one or more pathways suitable for coupling the component 102 to a backplane. In some implementations, these pathways may be electrical, optical, electromagnetic, fluidic, or mechanical. For example, in an electronic device, the interposer 104 may comprise pathways such as electrically conductive material suitable for conveying an electric current between the component 102 and the backplane. Likewise, an interposer 104 for an optical device may comprise an optical pathway either in free space or via a waveguide, optical pipe, and so forth, to convey photons between the component and backplane. The interposer 104 may also comprise fluidic channels allowing coupling of fluidic channels on the component to fluidic channels on the backplane. In other implementations, the interposer may comprise a mechanical joint or other mechanical connection between the component and the backplane.

The interposer 104 may have interconnects suitable for joining to the component 102 and the backplane 114, and as described above may provide pathways. FIG. 1 further illustrates interposer-to-component interconnects 106, as well as interposer-to-backplane interconnects 108. These interconnects may be joined via soldering, eutectic bonding, affixing with adhesive, mating an interference fit, filling a gap with a polymer, inserting an elastomeric material, proximity, and so forth. Once the component 102 and the interposer 104 have been joined at least in part by the interposer/component interconnects 106, they form a "T" sub-assembly 110.

FIG. 1B shows the "T" sub-assembly 110 being inserted into an aperture 112 in the backplane 114 along the direction indicated by an arrow. The backplane 114 has a height "B," and may comprise a printed circuit board, a larger assembly of other components, a rigid material, a semi-rigid material, a flexible material, and so forth. The "T" sub-assembly 110 is inserted into the aperture 112 whereupon the interposer/backplane interconnect(s) 106 may join the "T" sub-assembly 110 to the backplane 114. For example, where the joining is accomplished by soldering, heat may be applied to solder the "T" sub-assembly 110 to the backplane. Joining may comprise establishing one or more pathways. These pathways may be electrically conductive, may provide an optical path, establish an electromagnetic waveguide, provide a fluidic channel or a mechanical joint.

FIG. 1C shows the "T" sub-assembly 110 joined with the backplane 114 to form the assembly 116. The overall height "Z" of the interposer 104 and the backplane 114 is also shown. As depicted, the height "Z" is less than the sum of the height "C" of the component 102 and the height "B" of the backplane 114. Stated another way, Z<(C+B). As a result, assembly 116 has a lower-profile compared to assemblies formed via traditional SMT where the component is mounted atop the backplane and has a height of C+B. While a bottom of the component 102 is shown flush with the bottom of the backplane 114, in some implementations the component 102 may extend below the backplane 114.

As illustrated, an edge gap 118 may exist between an edge of the component 102 and the backplane 114. In some implementations, this gap may be filled with an adhesive, epoxy, polymer, elastomeric material, and so forth. Filling this edge gap 118 may improve longevity of the assembly by minimizing mechanical strain on the interposer 104 and on the interposer/component interconnects 106 and interposer/backplane interconnects 108. Where the filler is conductive, other benefits may accrue, such as the providing of an electrical ground between the component and the backplane 114.

In another implementation, the interposer/component interconnect 106 may be joined using a different material or process then that used in the interposer/backplane interconnect 108. For example, the interposer/component interconnect 106 may use a high temperature solder, while the interposer/backplane interconnect 108 may use a lower temperature solder. Thus, during joining the "T" sub-assembly 110 may be soldered to the backplane 114 without melting the interposer/component interconnect 106 solder.

In another implementation, a "T" sub-assembly 110 may not be used. For example, the component 102 may be placed within the backplane 114, an interposer 102 placed, and the interposer 102 may be joined to the component 102 and the backplane 114 at about the same time.

FIG. 2 depicts a cross-sectional view 200 of assembly 116 and an enlargement of an electrical pathway between the component 102 and the backplane 114 as provided by the interposer 104. A conductive path 202, such as a metal trace, on the interposer 104 provides a path for electric current, as shown by a double-headed arrow, to flow between a conductive path 202 on the component 102 and a conductive path 202 on the backplane 114. Thus, the interposer 104 couples the component 102 and the backplane 114.

Figure 3:
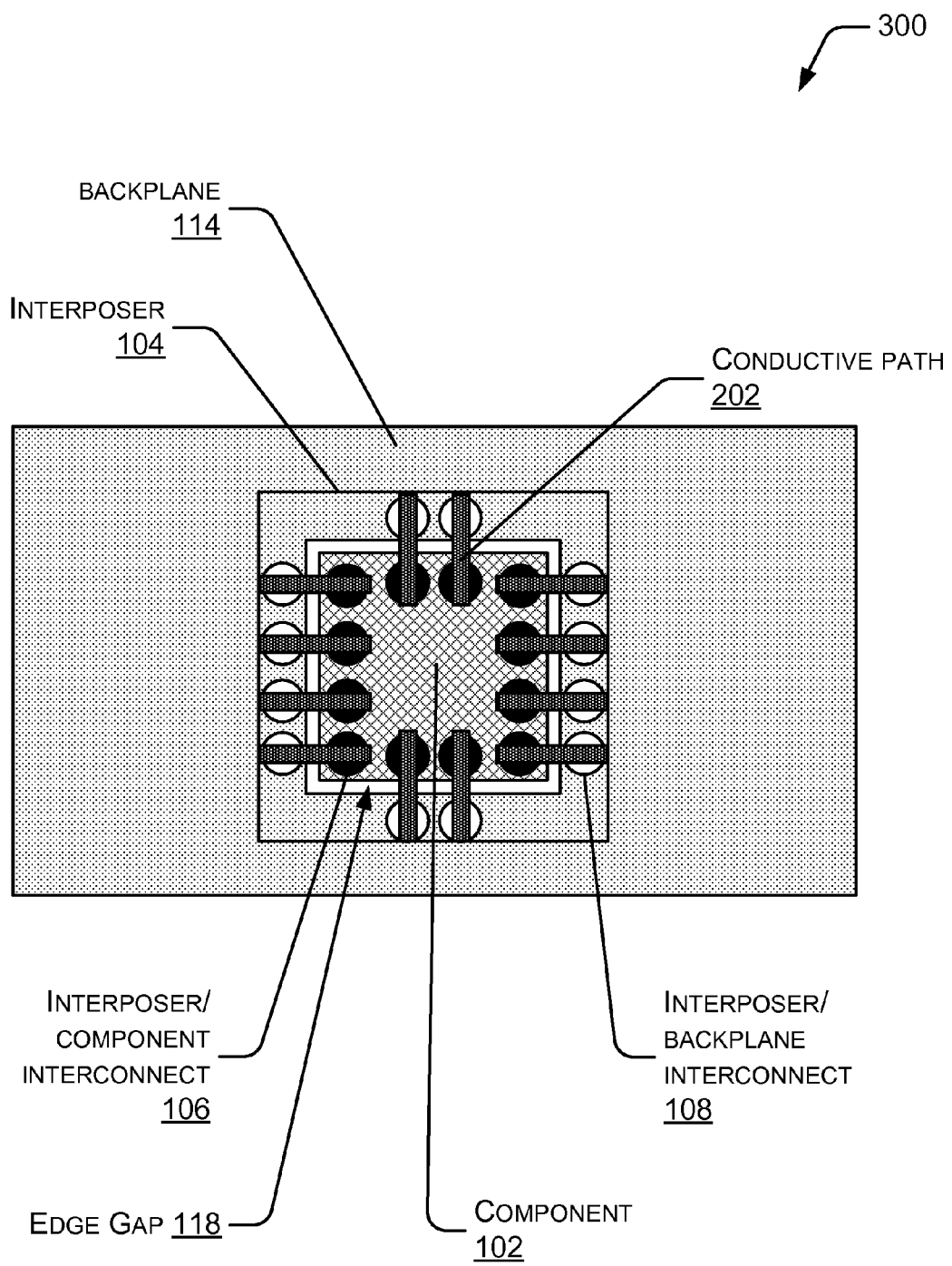
FIG. 3 is a plan view of a component and the backplane joined by the interposer.

FIG. 3 is a plan view 300 of a component 102 and the backplane 114 joined by the interposer 104 which provides a plurality of conductive pathways 202. In this view, the conductive paths 202 are shown bridging the interposer/component interconnects 106 and the interposer/backplane interconnects 108. Also shown is the edge gap 118 extending around the perimeter of the component 102.

Recessed "T" Sub-Assembly

Figure 4A:
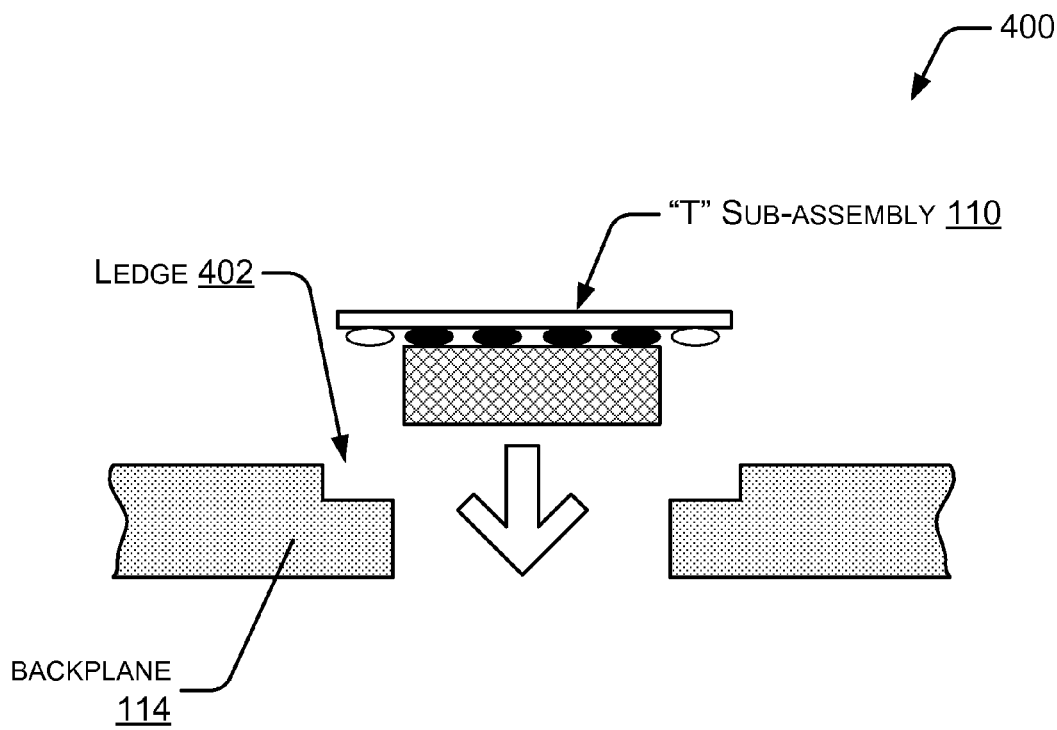
FIGS. 4A-4B depict cross-sectional views of a backplane comprising an aperture with a ledge configured to receive a portion of the interposer of the "T" sub-assembly, thus allowing the "T" sub-assembly to be at least partially recessed within the backplane.
Figure 4B:
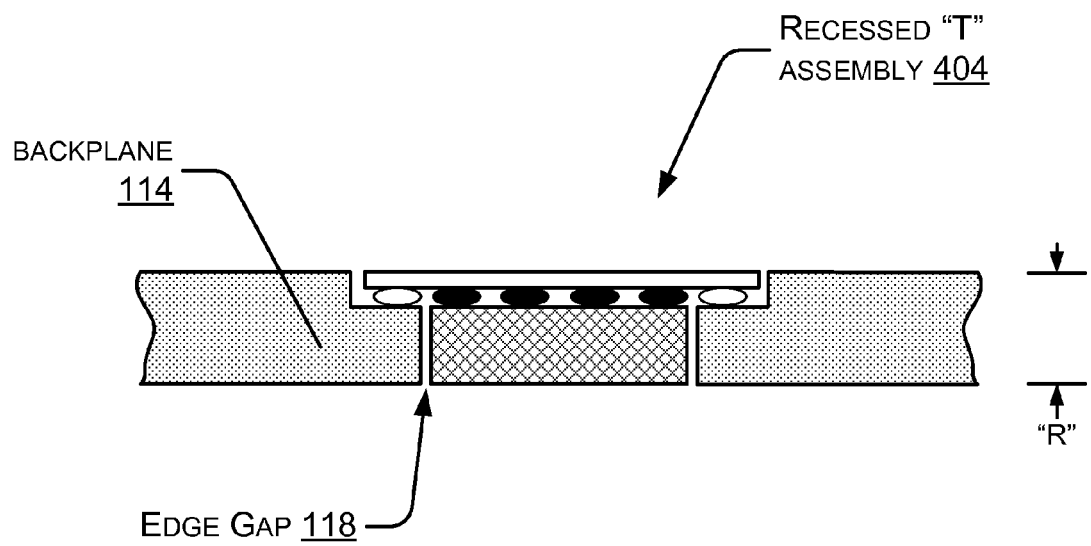

In some instances, the already slim low-profile assembly described above with respect to FIGS. 1-3 may be further reduced. FIGS. 4A-4B depict cross-sectional views 400 of a backplane 114 comprising a ledge 402 extending along at least a portion of the perimeter of aperture 112 and configured to receive a portion of the interposer of the "T" sub-assembly 110. This ledge 402 allows clearance for the upper portion of the "T" sub-assembly 110 to be at least partially recessed within the backplane 114. In FIG. 4A "T" sub-assembly 110 is placed along the direction indicated by an arrow into the aperture 112 in the backplane 114 having the ledge 402. At shown in FIG. 4B, once the "T" sub-assembly 110 is joined to the backplane 114, a recessed "T" assembly 402 results. The overall height "R" of this recessed "T" assembly 402 is less than the overall height "Z" as described above. Stated another way, R<Z<(C+B). In other implementations, the "T" sub-assembly 110 may not be fully recessed, and thus extend above the surface of the backplane.

"H" Sub-Assembly

Figure 5A:
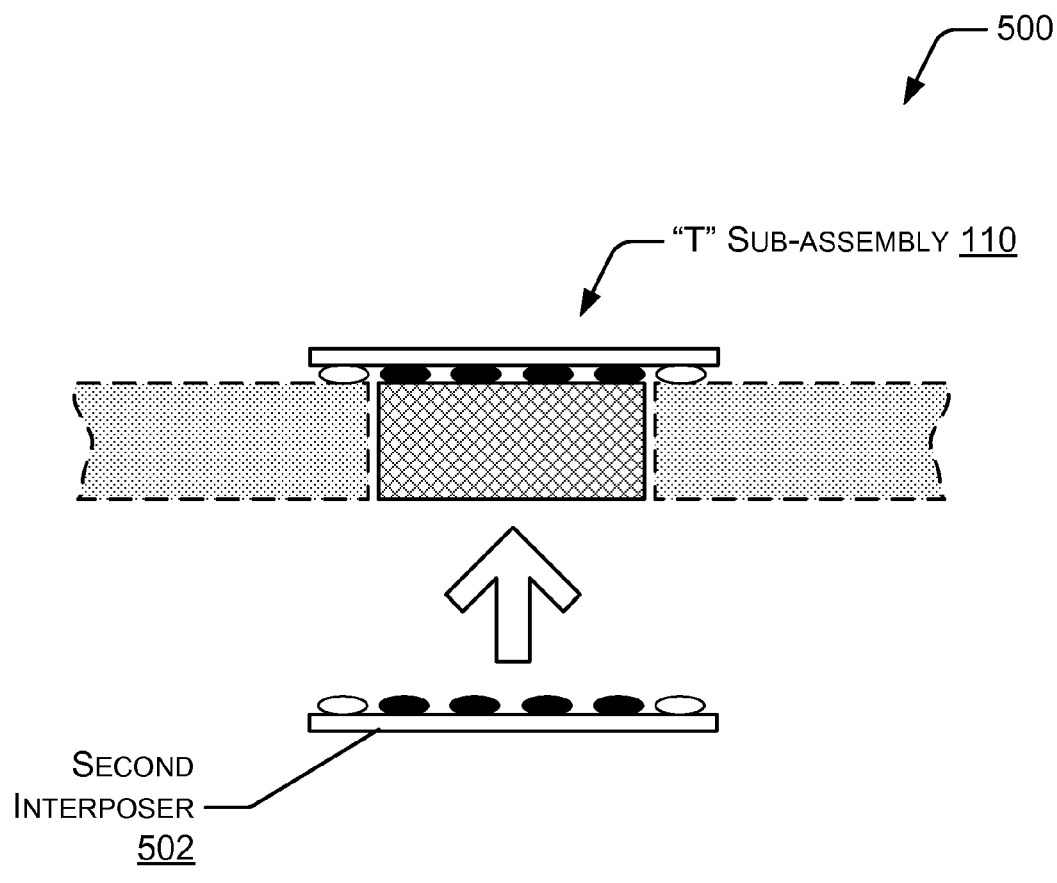
FIGS. 5A and 5B are cross-sectional views of joining a "T" sub-assembly with a second interposer to form an "H" sub-assembly.
Figure 5B:
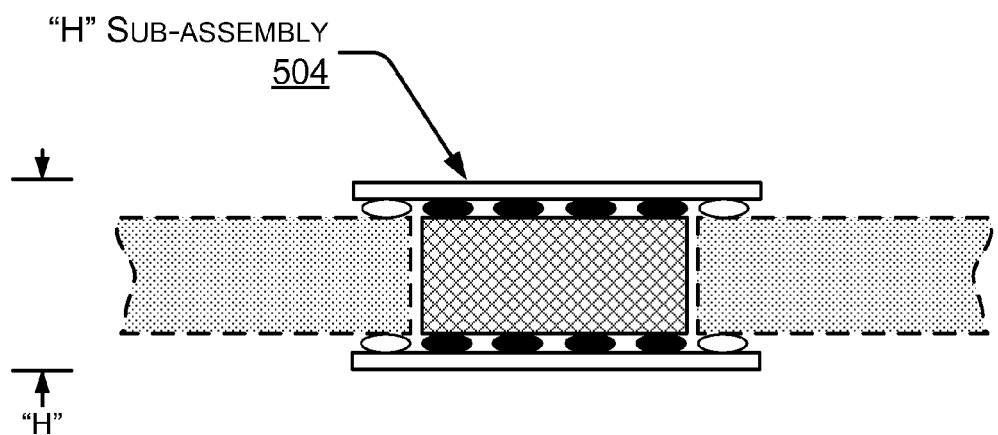

In some instances, it may be useful to provide additional pathways between the component 102 and the backplane 114. For example, a high density integrated circuit may be packaged such that contacts are on both a top and a bottom. FIGS. 5A and 5B depict cross-sectional views 500 of joining a "T" sub-assembly 110 with a second interposer 502 to form an "H" sub-assembly 504. This "H" sub-assembly has a height of "H."

To further reduce the profile, in some implementations one or both interposers 104 and 502 may be recessed as described above with respect to FIGS. 4A-4B. For example, a first interposer 104 in the "T" sub-assembly 110 may be recessed within the backplane 114 as shown in FIG. 4B.

"C" Sub-Assembly

Figure 6:
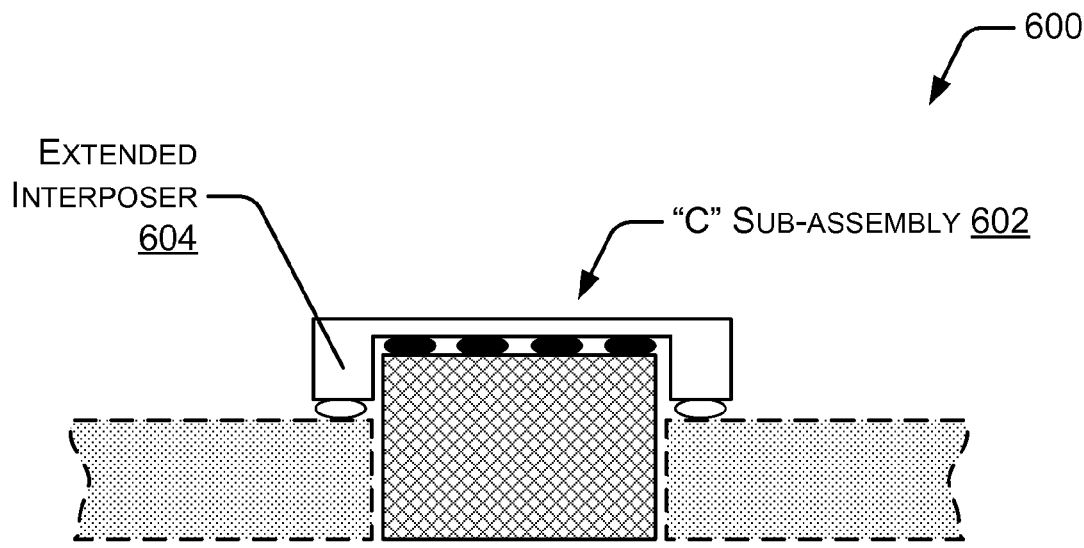
FIG. 6 is a cross sectional view of a "C" sub-assembly comprising an IC and an extended interposer.

In some implementations, the height "C" of component 102 may be such that a planar interposer such as interposer 104 is not able to establish a pathway between the component 102 and the backplane 114. In these instances, a "C" sub-assembly as shown in FIG. 6 may be used. FIG. 6 is a cross sectional view 600 of a "C" sub-assembly 602. "C" sub-assembly 602 comprises a component 102 having a top which extends beyond the height "B" of the backplane which is joined to an extended interposer 604. The extended interposer 604 is configured to provide a pathway between component 102 and backplane 114.

"T" Package

Figure 7:
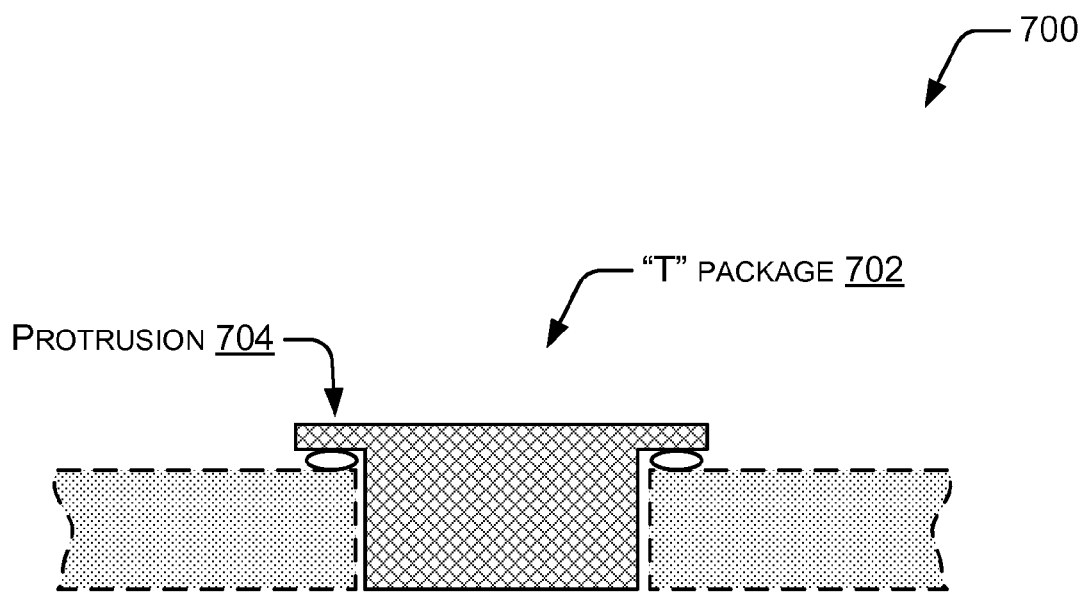
FIG. 7 is a cross-sectional view of a component comprising an integrated interposer within a "T" package.

Component packaging may be modified to include an interposer in some instances. FIG. 7 is a cross-sectional view 700 of a "T" package 702 for a component 102. The component 102 may have one or more protrusions 704. The protrusions 704 may be disposed to extend at least in part beyond an edge of the aperture 112 in which the component 102 resides. Protrusions 704 may also be configured to provide a coupling between the component 102 and the backplane 114. These protrusions 704 may be affixed to the component, or may be integral to the component.

Illustrative Processes

Figure 8:
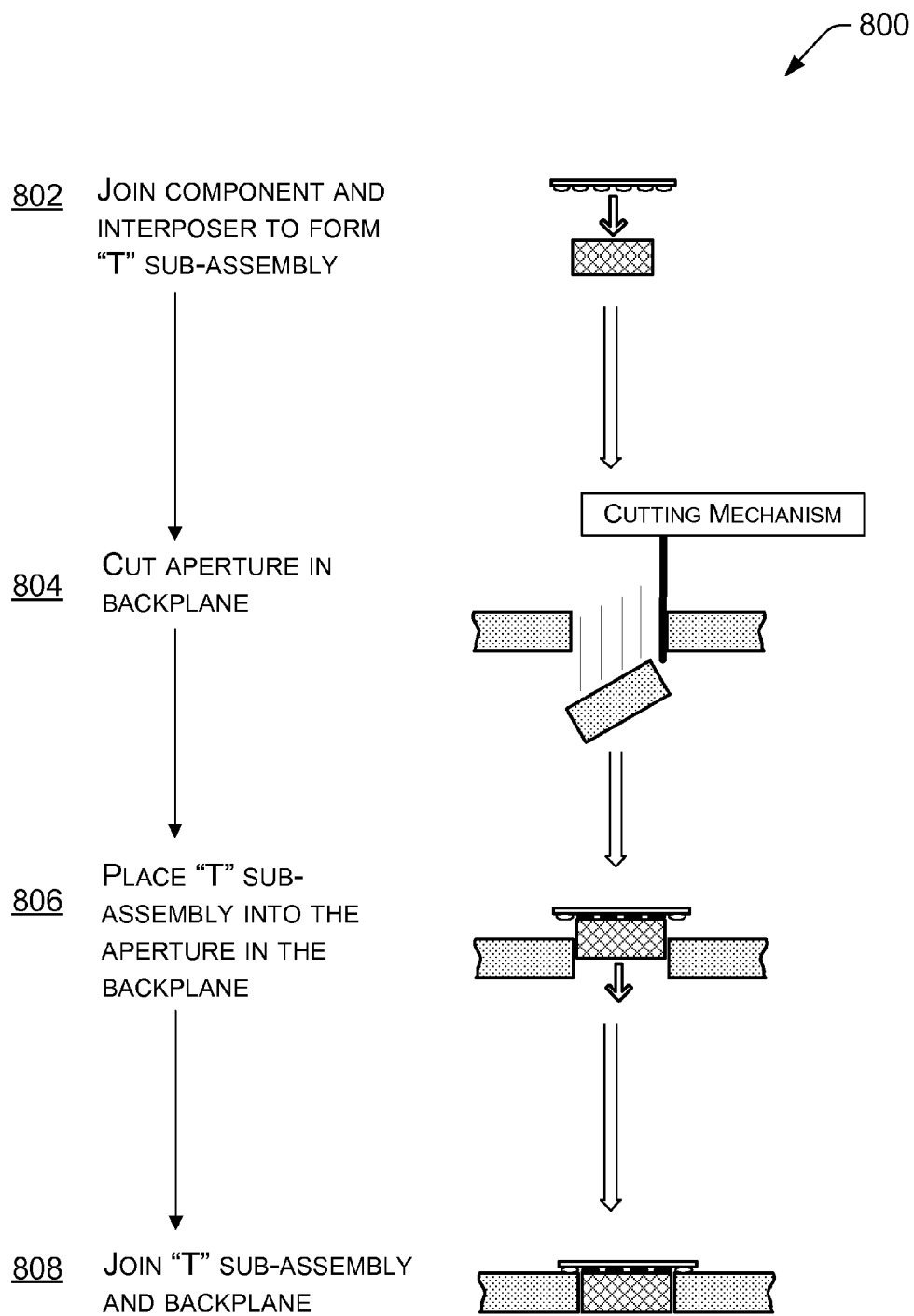
FIG. 8 illustrates an example process that includes forming a "T" sub-assembly, cutting an aperture in a backplane, placing the "T" sub-assembly within the aperture, and joining the "T" sub-assembly to the backplane.

FIG. 8 illustrates an example process 800 for assembling a low-profile assembly. Operation 802 joins a component 102, such as an integrated circuit, to an interposer to form a "T" subassembly 110. As described above, joining may comprise soldering, adhering, interfacing mechanically, and so forth.

Operation 804 cuts an aperture 112 in a backplane 114. A variety of mechanisms exist for placing apertures in a backplane, including cutting, routing, punching, ablating, vaporizing, and so forth. In another implementation, the backplane 114 may be formed with the aperture 112. However placed or formed, the aperture may pass through the entire thickness of the backplane 114.

Operation 806 places the "T" sub-assembly 110 into the aperture 112 in the backplane 114. Placement may occur manually or using a pick-and-place device or other automated equipment. While the figures in this application depict the "T" sub-assembly 110 being inserted from a top of the backplane 114, it is understood that the "T" sub-assembly 110 may be inserted from a bottom of the backplane 114 as well.

Operation 808 joins the "T" sub-assembly 110 and the backplane 114 to form an assembly 116. As described above, joining may comprise soldering, adhering, interfacing mechanically, and so forth. In some implementations, the edge gap 118 between the component 102 and the backplane 114 may be at least partially filled.

Figure 9:
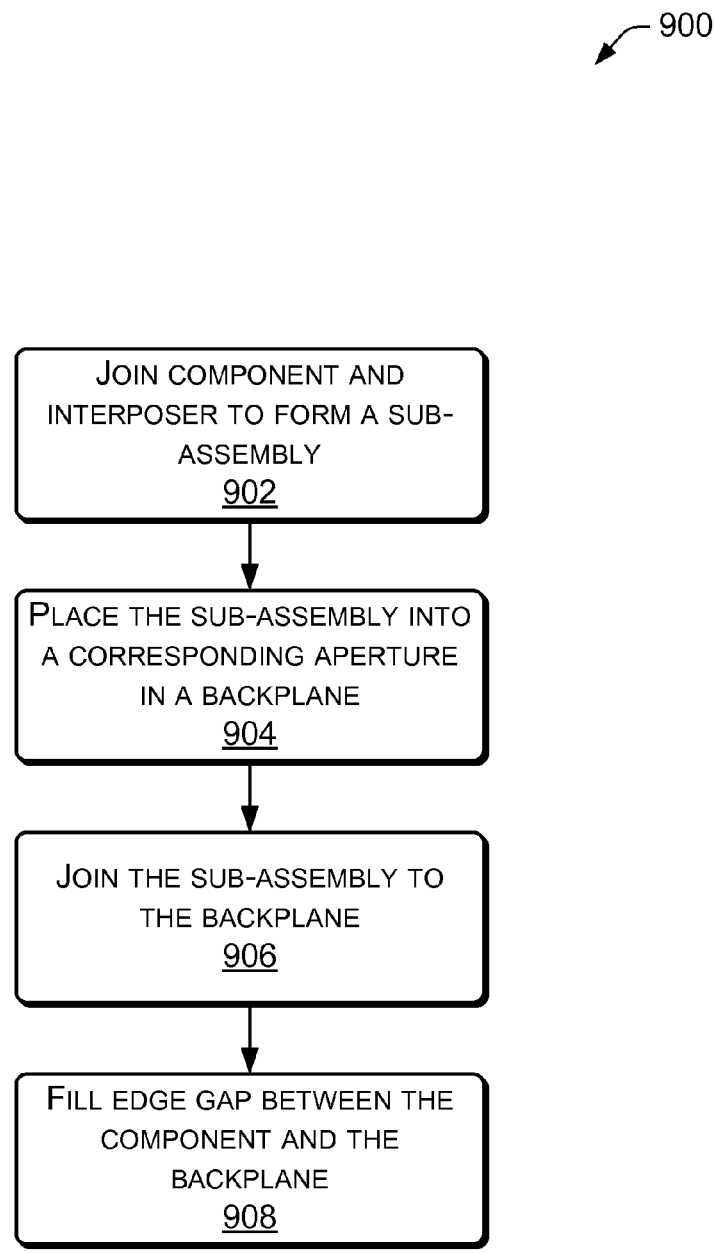
FIG. 9 is a flow diagram of an example process of building a low-profile assembly, such as the assemblies described in FIGS. 1-8.

FIG. 9 shows an illustrative process 900 of assembling a low-profile device. The process 900 is illustrated as a collection of blocks in a logical flow graph, which represent a sequence of operations that can be implemented in hardware, software, or a combination thereof. In the context of software, the blocks represent computer-executable instructions that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the process. For discussion purposes, the process will be described in the context of the examples of FIGS. 1-8, but may be utilize other devices.

Block 902 joins a component and an interposer to form a sub-assembly. Joining may comprise soldering, adhering, interfacing mechanically, and so forth. Block 904 places the sub-assembly into a corresponding aperture in a backplane. The corresponding aperture completely passes through the backplane (although it need not) and is sized to accept the component. Block 906 joins the sub-assembly to the backplane. As above, joining may comprise soldering, adhering, interfacing mechanically, and so forth. Block 908 fills at least a portion of the edge gap between the component and the backplane.

Moreover, the acts and methods described may be implemented by a computer, processor or other computing device based on instructions stored on memory, the memory comprising one or more computer-readable storage media (CRSM).

The CRSM may be any available physical media accessible by a computing device to implement the instructions stored thereon. CRSM may include, but is not limited to, random access memory (RAM), read-only memory (ROM), electrically erasable programmable read-only memory (EEPROM), flash memory or other solid-state memory technology, compact disk read-only memory (CD-ROM), digital versatile disks (DVD) or other optical disk storage, magnetic cassettes, magnetic tape, magnetic disk storage or other magnetic storage devices, or any other medium which can be used to store the desired information and which can be accessed by a computing device.

Conclusion

As shown above, very low profile assemblies are possible, leading to lower profile devices. Although the subject matter has been described in language specific to structural features and/or methodological acts, it is to be understood that the subject matter defined in the appended claims is not necessarily limited to the specific features, dimensions, or acts described. Rather, the specific features, dimensions, and acts are disclosed as illustrative forms of implementing the claims. Moreover, any of the features of any of the devices described herein may be implemented in a variety of materials or similar configurations.

What is claimed is:

1. A device comprising:
   a circuit board; and
   an interposer coupled to a surface mount component and the circuit board, the interposer including at least fluidic channels for coupling fluidic channels on the surface mount component to fluidic channels on the circuit board.

2. The device of claim 1, the circuit board including an aperture extending through the circuit board, the aperture containing at least a portion of the surface mount component.

3. The device of claim 1, the interposer further including one or more electrical conductors, optical paths, electromagnetic waveguides, and mechanical joints for coupling the surface mount component to the circuit board.

4. The device of claim 3, the electrical conductors conveying electric current between the surface mount component and the circuit board.

5. The device of claim 3, the optical paths conveying photons between the surface mount component and the circuit board in free space or via a waveguide or optical pipe.

6. A device comprising:
   a backplane; and
   an electronic component having a main body affixed to an interposer and being configured to fit within an aperture in the backplane, the interposer including one or more fluidic channels for coupling the electronic component to the backplane, wherein at least one of the one or more fluidic channels on the interposer couples a fluidic channel on the backplane with a fluidic channel on the electronic component.

7. The device of claim 6, the interposer further including interconnects for coupling the electronic component to the backplane, the interconnects including the one or more fluidic channels.

8. The device of claim 6, the interconnects coupling the electronic component to the backplane by:
   soldering;
   affixing with adhesive;
   mating an interference fit;
   filling a gap with a polymer; or
   inserting an elastomeric material.

9. The device of claim 6, the interposer including an extension, the extension comprising a length of the interposer that extends beyond the electronic component.

10. The device of claim 9, the aperture being stepped to provide a ledge, the ledge receiving the extension and the electronic component at least partially within the backplane.

11. A device comprising:
    a component coupled to an interposer by one or more interposer-to-component interconnects, the interposer including a first set of fluidic channels; and
    a circuit board including a second set of fluidic channels for coupling to a third set of fluidic channels on the component via the first set of fluidic channels.

12. The device of claim 11, the circuit board further including an aperture and a ledge, the aperture and the ledge configured for receiving the component coupled to the interposer.

13. The device of claim 11, the interposer-to-component interconnects comprising a fourth set of fluidic channels for interacting with the first set of fluidic channels to couple the third set of fluidic channels on the component to the second set of fluidic channels on the circuit board.

14. The device of claim 11, the circuit board further including one or more electrical conductors, optical paths, electromagnetic waveguides, and mechanical joints for coupling the component and the circuit board.

15. The device of claim 14, the component further comprising one or more electrical conductors, optical paths, electromagnetic waveguides, and mechanical joints for interacting with respective of the one or more electrical conductors, optical paths, electromagnetic waveguides, and mechanical joints on the circuit board for coupling the component and the circuit board.

16. The device of claim 11, further comprising interposer-to-circuit board interconnects for coupling the component and the circuit board.

17. The device of claim 16, the interposer-to-circuit board interconnects including a fourth set of fluidic channels for coupling the third set of fluidic channels on the component to the second set of fluidic channels on the circuit board via the first set of fluidic channels.

18. The device of claim 17, the fourth set of fluidic channels in the interposer-to-circuit board interconnects interacting with a fifth set of fluidic channels included in interposer-to-component interconnects to establish one or more pathways between the component and the circuit board.

19. The device of claim 1, the surface mount component and the circuit board being coupled such that an edge gap exists between the surface mount component and the circuit board and the edge gap is filled with a conductive filler.

20. The device of claim 19, the conductive filler providing an electrical ground between the surface mount component and the circuit board.

* * * * *